(12) United States Patent
Najafi et al.

(10) Patent No.: US 10,598,491 B2
(45) Date of Patent: Mar. 24, 2020

(54) STACKED BALANCED RESONATORS

(71) Applicant: THE REGENTS OF THE UNIVERSITY OF MICHIGAN, Ann Arbor, MI (US)

(72) Inventors: Khalil Najafi, Ann Arbor, MI (US); Ali Darvishian, Ann Arbor, MI (US)

(73) Assignee: THE REGENTS OF THE UNIVERSITY OF MICHIGAN, Ann Arbor, MI (US)

( * ) Notice: Subject to any disclaimer, the term of this patent is extended or adjusted under 35 U.S.C. 154(b) by 181 days.

(21) Appl. No.: 15/841,782

(22) Filed: Dec. 14, 2017

(65) Prior Publication Data

US 2018/0283866 A1 Oct. 4, 2018

Related U.S. Application Data

(60) Provisional application No. 62/433,933, filed on Dec. 14, 2016.

(51) Int. Cl.
*G01C 19/574* (2012.01)
*H03H 9/00* (2006.01)
(Continued)

(52) U.S. Cl.
CPC ......... *G01C 19/574* (2013.01); *H03H 9/0023* (2013.01); *H03H 9/02259* (2013.01);
(Continued)

(58) Field of Classification Search
CPC ............. H03H 9/0023; H03H 9/02244; H03H 9/02338; H03H 9/02362; H03H 9/02393; H03H 9/02409; H03H 9/0547; H03H 9/0595; H03H 9/1057; H03H 9/2405; H03H 9/462; H03H 9/467; H03H 2009/02385; H03H 2009/0244; H03H 2009/02496; H03H 2009/02511; H03H 2009/2442; H03H 9/02259; G01C 19/5733; G01C 19/574; G01C 19/5747
(Continued)

(56) References Cited

U.S. PATENT DOCUMENTS 6,250,156 B1 * 6/2001 Seshia ................ G01C 19/5719
73/504.12
6,566,988 B2 5/2003 Muzutani et al.
(Continued)

*Primary Examiner* — Barbara Summons
(74) *Attorney, Agent, or Firm* — Harness, Dickey & Pierce, P.L.C.

(57) ABSTRACT

A resonator array comprises substantially paralleled first and second resonant layers having resonating masses. A first set of lateral drive electrodes cause the first resonating mass to vibrate along an axis in a first geometric plane. A second set of lateral drive electrodes cause the second resonating mass to vibrate along an axis in a second geometric plane in an opposite direction of the first resonating mass by about 180 degrees. Rotation in the system causes the masses to vibrate out-of-plane in opposite directions. The opposite vibrational directions of the first and second resonating masses produces a balanced system with small motion in a bonding area between the stacked resonators. As a result, there is minimal propagation of mechanical waves from the balanced system to a substrate resulting in lower anchor loss and a high Q-factor.

17 Claims, 9 Drawing Sheets

(51) Int. Cl.
  *H03H 9/02*  (2006.01)
  *H03H 9/24*  (2006.01)

(52) U.S. Cl.
  CPC .... *H03H 9/02362* (2013.01); *H03H 9/02409* (2013.01); *H03H 9/2405* (2013.01); *H03H 2009/0244* (2013.01)

(58) Field of Classification Search
  USPC .................................................. 333/186, 188
  See application file for complete search history.

(56) References Cited

U.S. PATENT DOCUMENTS

| | | |
|---|---|---|
| 7,541,896 B2 | 6/2009 | Fukunaga |
| 7,902,944 B2 | 3/2011 | Fukunaga |
| 8,997,568 B2* | 4/2015 | Leverrier ........... G01C 19/5747 |
| | | 73/504.12 |
| 9,109,893 B2* | 8/2015 | Heller .................... G01C 19/56 |
| 2013/0105921 A1* | 5/2013 | Najafi ................. G01P 15/0802 |
| | | 257/415 |

* cited by examiner

STACKED BALANCED RESONATORS

CROSS-REFERENCE TO RELATED APPLICATIONS

This application claims the benefit of U.S. Provisional Application No. 62/433,933, filed on Dec. 14, 2016. The entire disclosure of the above application is incorporated herein by reference.

GOVERNMENT CLAUSE

This invention was made with government support under Grant No. N66001-11-C-4170 awarded by the United States Department of the Navy/Office of Naval Research. The Government has certain rights in this invention.

FIELD

The present disclosure relates to resonators, gyroscopes, and inertial sensors.

BACKGROUND

Mechanical resonators are used in a wide range of applications, including gyroscopes, filters, accelerometers, and clocks. Performance of a mechanical resonator is enhanced by maximizing the quality factor ("Q-factor"). The Q-factor refers to the ability of the system to keep energy. Typically, energy dissipation occurs in instances including squeeze film damping, thermoselastic dissipation ("TED"), surface loss, phono-phonon and phono-electron interactions, and anchor loss. TED and phono-phonon and phono-electron interactions are intrinsic losses and are traditionally reduced by carefully selecting the resonator material. Surface loss is traditionally minimized using various surface treatments, and squeeze film dissipation is traditionally reduced by operating the resonator in a vacuum. Comparatively, anchor loss has not been easy to control. Thus, it is desirable to have a device and method to reduce anchor loss, thereby increase the Q-factor in mechanical resonators.

This section provides background information related to the present disclosure which is not necessarily prior art.

SUMMARY

This section provides a general summary of the disclosure, and is not a comprehensive disclosure of its full scope or all of its features.

A resonator is presented with a stacked arrangement. The resonator is comprised of a first resonant mass and a second resonant mass. The first resonant mass is spatially separated from a first support structure and is movably coupled by at least one elastic member at an anchor point to the first support structure. The first resonant mass defines a longitudinal axis residing in a first geometric plane. A first set of drive electrodes are disposed adjacent to the first resonant mass along a periphery of the first resonant mass. The first set of drive electrodes is configured to vibrate the first resonant mass along an axis defining the first geometric plane. Likewise, the second resonant mass is spatially separated from a second support structure and is movably coupled by at least one elastic member at an anchor point to the second support structure. The second resonant mass also defines a longitudinal axis residing in a second geometric plane, such that the second geometric plane differs from the first geometric plane but is substantially parallel with the first geometric plane. A second set of drive electrodes are disposed adjacent to the second resonant mass along a periphery of the second resonant mass. The second set of drive electrodes is configured to vibrate the second resonant mass along the same axis as the first resonant mass but 180 degrees out-of-phase with movement of the first resonant mass.

In one example embodiment, the first support structure is a planar body having a cutout therein and the first resonant mass is a planar body arranged in the cutout of the first support structure. The first resonant mass is movably coupled by two or more elastic members at two or more anchor points to the first support structure. Similarly, the second support structure is a planar body having a cutout therein and the second resonant mass is a planar body arranged in the cutout of the second support structure. The second resonant mass is movably coupled by two or more elastic members at two or more anchor points to the second support structure. Of note, each anchor point on the first support structure aligns with and is fixedly coupled to a corresponding anchor point on the second support structure. In some embodiments, the elastic members are further defined as meander springs.

The resonator may further include sense electrodes. For example, a first set of sense electrodes may be disposed adjacent to the first resonant mass and configured to sense movement of the first resonant mass; and a second set of sense electrodes may be disposed adjacent to the second resonant mass and configured to sense movement of the second resonant mass.

The resonator may also include tuning electrodes. A first set of tuning electrodes is disposed adjacent to the first resonant mass and configured to generate an electric field that surrounds the first resonant mass and thereby changes natural oscillating frequency of the first resonant mass. A second set of tuning electrodes is disposed adjacent to the second resonant mass and configured to generate an electric field that surrounds the second resonant mass and thereby changes natural oscillating frequency of the second resonant mass.

Further areas of applicability will become apparent from the description provided herein. The description and specific examples in this summary are intended for purposes of illustration only and are not intended to limit the scope of the present disclosure.

DRAWINGS

The drawings described herein are for illustrative purposes only of selected embodiments and not all possible implementations, and are not intended to limit the scope of the present disclosure.

Corresponding reference numerals indicate corresponding parts throughout the several views of the drawings.

DETAILED DESCRIPTION

Example embodiments will now be described more fully with reference to the accompanying drawings.

Figure 1:
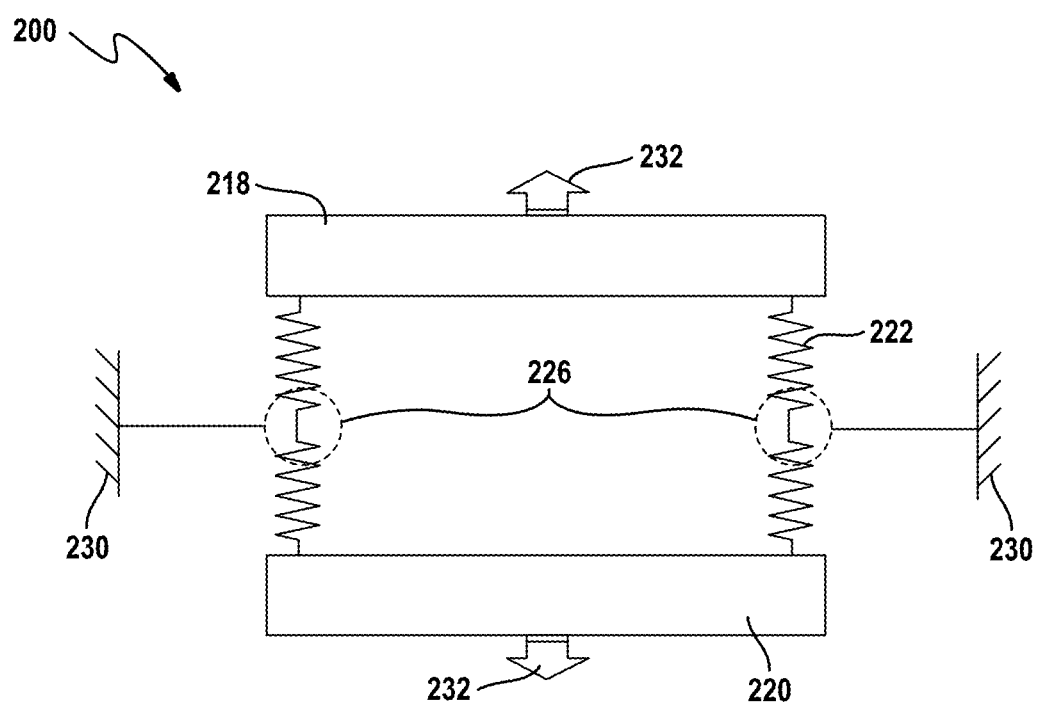
FIG. 1 is a simplified lumped model of an exemplary stacked resonator.

FIG. 1 is a simplified lumped model of an exemplary stacked resonator 200. The resonator 200 is comprised of a first resonating plate 218 (i.e., first resonant mass) and a second resonating plate 220 (i.e., a second resonant mass) that is substantially parallel with the first resonating plate 218. The first resonate plate 218 is movably coupled by at least one elastic member 222 at an anchor point 226 to a support structure 230. Likewise, the second resonant plate 220 is movably coupled by at least one elastic member 222 at the anchor point 226 to a support structure 230. In this model, the first and second resonating plates are coupled by two elastic members 222 and the elastic members are in the form of a spring. It is understood that more or less elastic members may be used to movably couple the resonating plates to the support structure.

When a resonator moves, a portion of its vibrational energy is lost due to wave propagation into the support structure. The associated loss is commonly referred to as anchor loss or attachment dissipation. Performance of a mechanical resonator is often characterized through its quality factor (Q), which represents the amount of energy stored vs. energy lost in the resnotaor. The lower the loss, the higher the Q. Performance is, therefore, enhanced by maximizing the Q-factor. In the case of a resonant mechanical gyro, it is desirable to maximize the Q in order to improve gyroscope performance. Gyroscopes can measure rotation rate around any of three axes, one axis which is perpendicular to the plane in which the gyroscope's resonator lays, and two axes that lay in the plane of the gyroscope. Gyroscopes that measure rotation around the out of plane axis are referred to as yaw rate gyroscopes, and those that measure rotation rate around the in-plane axes are referred to pitch and roll rate gyroscpoes. In the case of pitch and roll gyroscopes, it is particularly important that the resonator has a large Q-factor in the out-of-plane resonant mode. When the gyroscope's resonators are forced to vibrate in plane and opposite in direction, and when there is pitch and roll rotation in the system, Coriolis acceleration causes the gyroscope's resonators to also vibrate out-of-plane in opposite directions as indicated at 232 in FIG. 1 (note that the gyroscope's resonators vibration in plane is not shown here). As a result of the opposing motion, there is small to negligible motion at the areas where the stacked resonators are bonded together, e.g., anchor points 226. In such instances, energy that would typically propagate to the support structure stays within the resonator and/or is transferred between the bonded stacked resonators, thereby reducing anchor loss and maximizing the Q-factor.

Figure 2A:
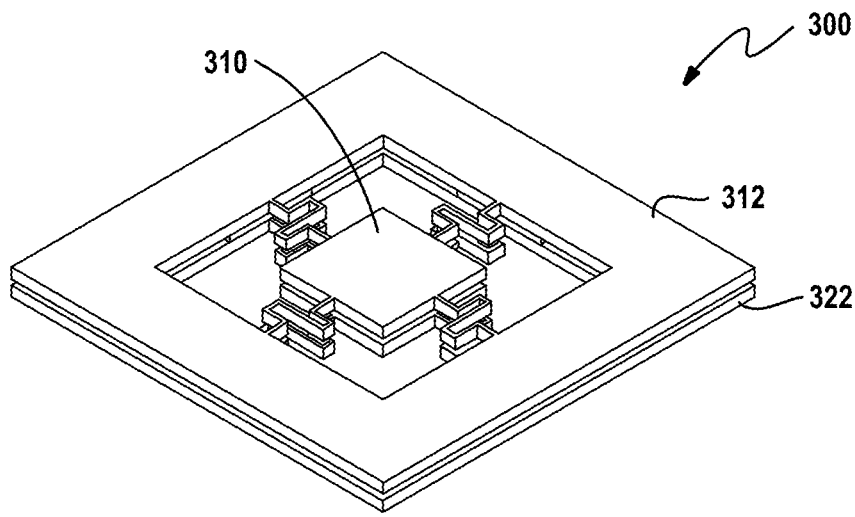
FIG. 2A is a perspective view of an example embodiment of a resonator with the stacked arrangement.
Figure 2B:
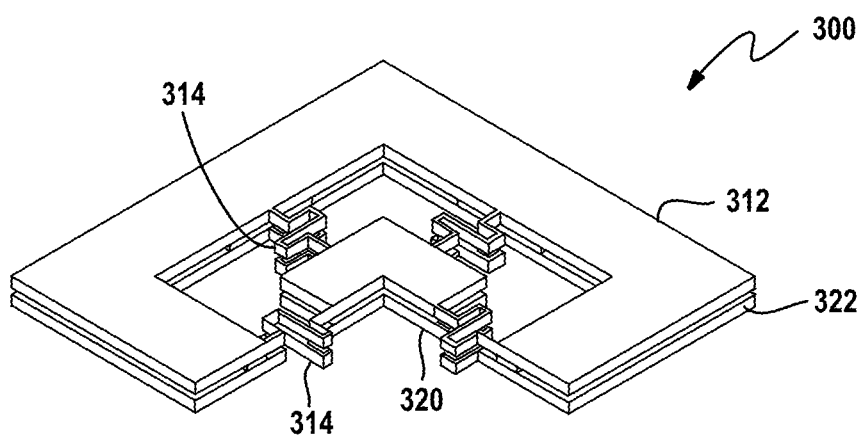
FIG. 2B is a cutaway perspective view of the example embodiment of the resonator.
Figure 2C:
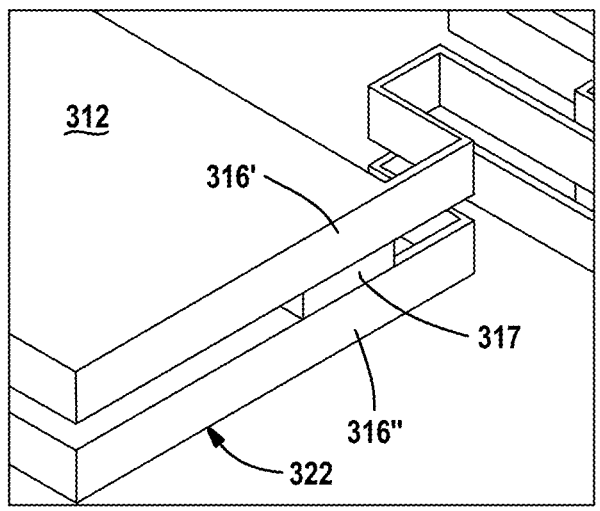
FIG. 2C is a cross-section view of a portion of the resonator depicting the anchor point between two support structures of the resonator.

FIGS. 2A-2C depicts an example embodiment of a resonator 300 with the stacked arrangement. The resonator 300 is comprised of a first resonant mass 310 arranged on top of a second resonant mass 320. In this embodiment, each resonant mass has a corresponding support structure. That is, the first resonant mass 310 is spatially separated from a first support structure 312 and the second resonant mass 320 is spatially separated from a second support structure 322. More specifically, the first support structure 312 is a planar body having a square shape and a square cutout therein. The first resonant mass 310 is also a planar body having a square shape and is arranged in the cutout of the first support structure 312. Similarly, the second support structure 322 is a planar body having a square shape and a square cutout therein. The second resonant mass 320 is a planar body with a square shape and is arranged in the cutout of the second support structure 322. It is understood that these components may take on different shapes.

Of note, the first resonant mass 310 is substantially parallel with the second resonant mass 320. Specifically, the first resonant mass 310 has a longitudinal axis residing in a first geometric plane and the second resonant mass has a longitudinal axis residing in a second geometric plane that differs from the first geometric plane, where the longitudinal axis of the masses are substantially parallel with each other as seen in FIG. 2B.

In this example embodiment, the first and second resonant masses 310, 320 are movably coupled by four elastic members to their respective support structure. For example, the elastic members are in the form of meander springs 314. It is readily understood that the elastic members can take other forms, including beams. Each elastic member is coupled to the support structure at a corresponding anchor point 316. An anchor point 316' on the first support structure 312 aligns with and is fixedly coupled (e.g., bonded) at 317 to the corresponding anchor point 316" on the second support structure 322 as best seen in FIG. 2C.

Figure 3A:
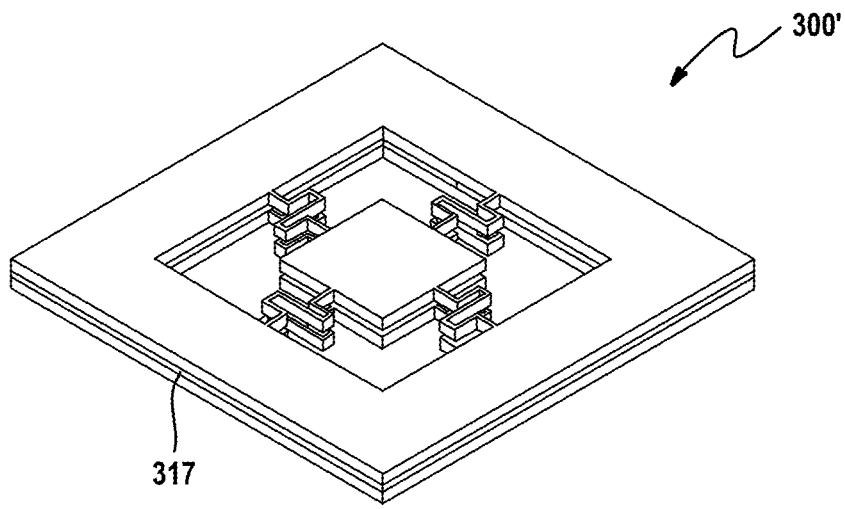
FIGS. 3A-3C are views of another example embodiment of a resonator where the bonding extends the entire length and width of the interface between the two support structures.
Figure 3B:
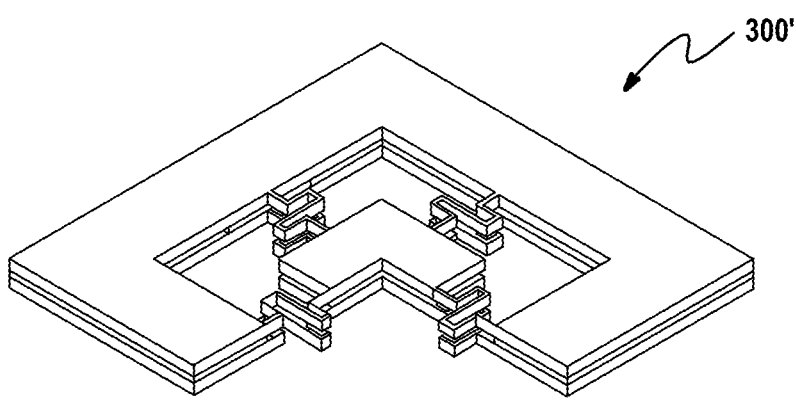
Figure 3C:
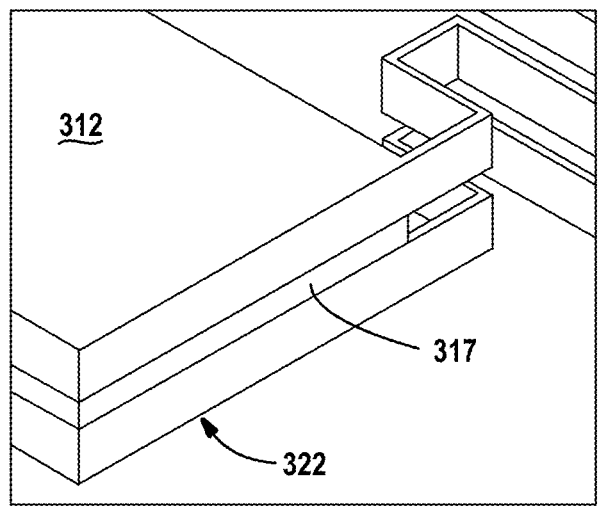

FIGS. 3A-3C depict another example embodiment of a resonator 300' with the stacked arrangement. In this example, the bonding 317 between the first support structure 312 and the second support structure 322 extends along the entire length and width of the interface between the support structures. Except with respect to the differences discussed herein, the resonator 300' may be substantially the same as the resonator 300 described above in relation to FIGS. 2A-2C.

Figure 4:
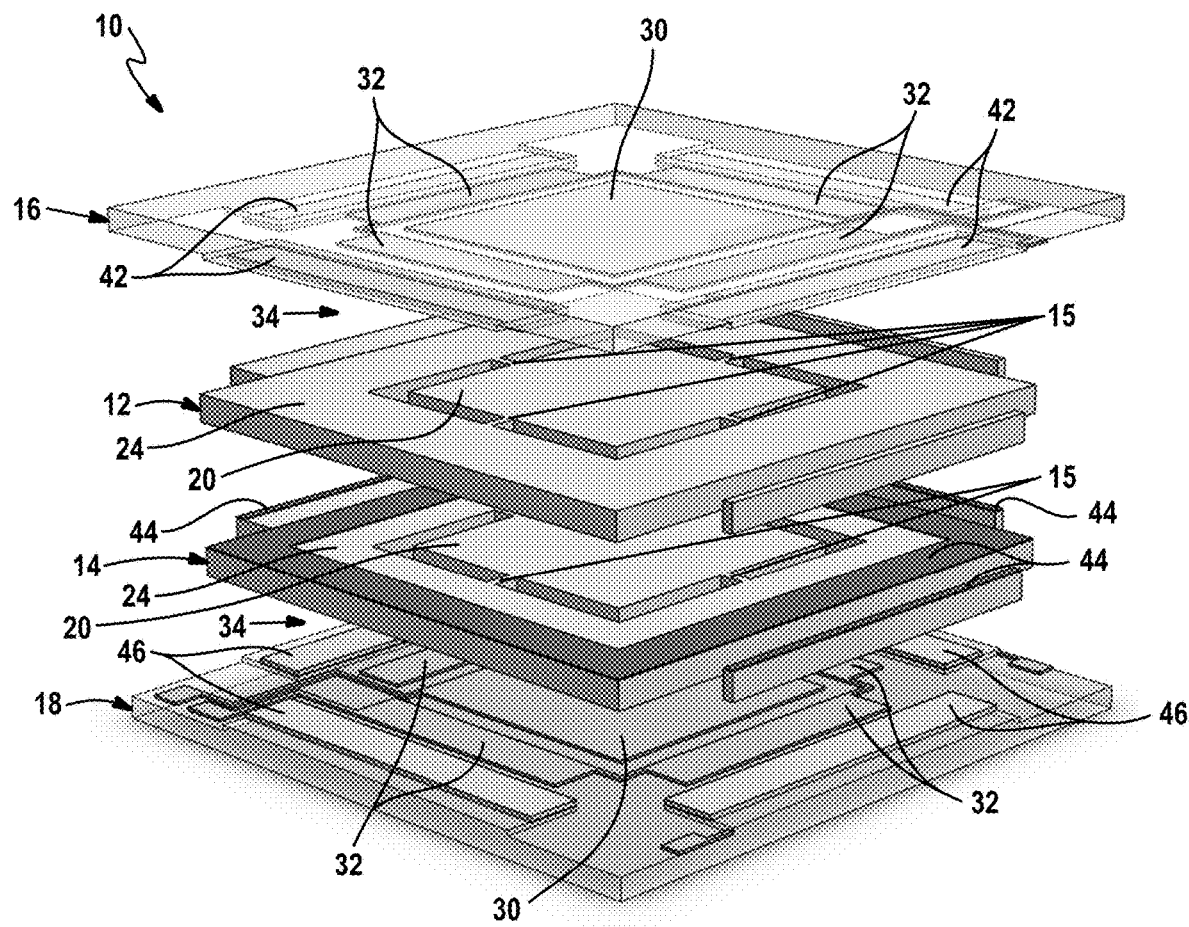
FIG. 4 is an exploded perspective view of an example resonator device.

FIG. 4 depicts an example of a resonator device 10. The resonator device includes first and second mechanical resonators 12, 14 and a first cap 16 opposing a second cap 18. The first resonator 12 is substantially parallel with the second resonator 14. The first and second caps 16, 18 sandwich the first and second resonators 12, 14. Each cap 16, 18 includes a center platform 30 and a plurality of supporting members 32. Sense gaps and/or sensing gaps 34 exist between the first and second caps 16, 18 and the respective resonators 12, 14. Dimension of the sense gaps 34 are easily adjustable.

Each resonator 12, 14 includes a resonating plate 20 and a support structure 24. The resonating plate 20 of the first resonator 12 resides in a first geometric plane and is coupled by at least one elastic member 15 to the support structure 24 of the first resonator 12. For example only, the resonating plate 20 of the first resonator 12 may be coupled by four elastic members 15 to the support structure 24. The resonating plate 20 of the second resonator 14 resides in a second geometric plane and is coupled by at least one elastic member 15 to the support structure of the second resonator 14. For example only, the resonating plate 20 of the second resonator 14 may be coupled by four elastic members 15 to the support structure 24. Though reference is made herein to first and second resonators having the same configurations and properties it is understood that in certain instances the first and second resonators may differ.

It is understood that the exemplary resonator device 10 may in certain instances include additional resonators and/or layers that are substantially parallel with the described first and second resonators 12, 14. The additional layers are also sandwiched by the described first and second caps 16, 18. For example only, the resonator array 10 may in certain instances include an additional intermediate layer (not shown) disposed between the first resonator 12 and the second resonator 14. The intermediate layer may have a first side that faces the first resonator 12 and a second side that faces the second resonator 14. Sensing electrodes may be disposed on both the first and the second sides of the intermediate layer. The sensing electrodes may function to sense the motion of the resonating plate 20 of the first resonator 12 and the resonating plate 20 of the second resonator 14. A set of tuning electrodes may also be disposed on the first and second sides of the intermediate layer. As further described below, the tuning electrodes may function to tune a resonant frequency of the resonating plate 20 of the first resonator 12 and the resonating plate 20 of the second resonator 14.

Additionally, first bonding films 42 are disposed between the first cap 16 and the first resonator 12. Second bonding films 44 are disposed between the first resonator 12 and the second resonator 14. Third bonding films 46 are disposed between the second resonator 14 and the second cap 18. The bonding films 42, 44, 46 collectively extend around a majority of the perimeter of the caps 16, 18 and the resonators 12, 14. It is understood, that the bonding films 42, 44, 46 may take other forms, lengths, and, configurations, and may appear in various combinations thereof.

By way of example, the bonding films 42, 44, 46 may have a thickness of 10 μm. In some instances, the bonding films 44 disposed between the first resonator 12 and the second resonator 14 may be larger than the bonding films 42, 46 disposed between the resonators 12,14 and the corresponding caps 16, 18. In some instances (not shown), bonding films are disposed only between the resonators and the corresponding caps and the first and second resonator are directly bonded. Furthermore, in some instances (not shown), bonding films are disposed only between the first and second resonators, and the caps and the corresponding first and second resonator are directly bonded.

Figure 5:
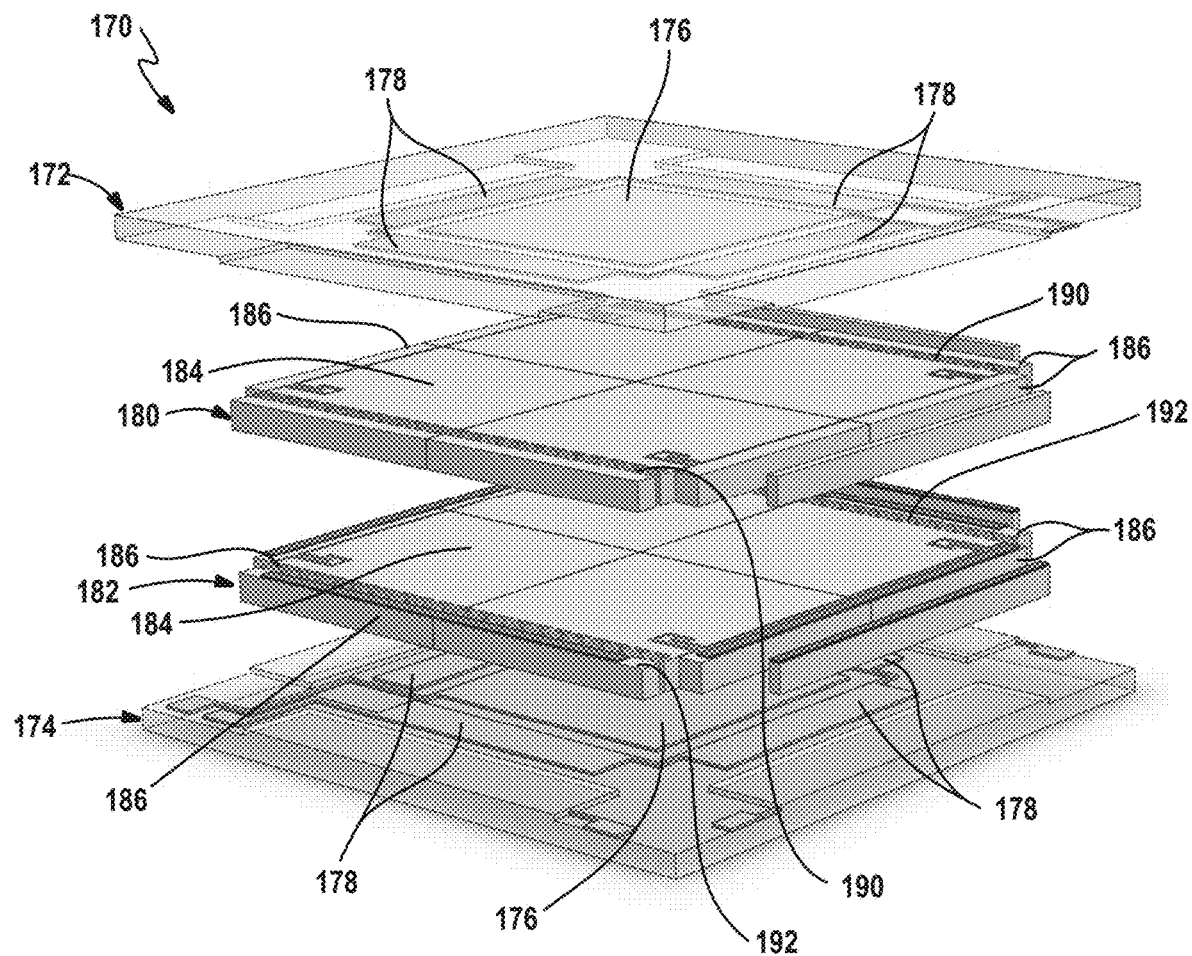
FIG. 5 is an exploded perspective view of an example gyroscope system.

FIG. 5 illustrates an exemplary gyroscope system 170. The gyroscope system 170 incorporates the resonator device 10 described above in relation to FIG. 4. Though reference is made herein to gyroscopes, it is understood that the same concepts may be applied in various instances and with various devices, such as accelerometers, filters, and timing references.

The gyroscope system 170 includes first and second mechanical resonators and/or resonant layers 180, 182 and a first cap 172 opposing a second cap 174. The first resonator 180 is substantially parallel with the second resonator 182. The first and second caps 172, 174 sandwich the first and second resonators 180, 182.

Each resonator 180, 182 includes a resonating plate 184 and a support structure 186. The resonators 180, 182 may be formed of silicon. The resonating plate 184 of the first resonator 180 resides in a first geometric plane and is coupled by at least one elastic member (not shown) to the support structure 186 of the first resonator 180. The resonating plate 184 of the second resonator 182 resides in a second geometric plane and is coupled by at least one elastic member (not shown) to the support structure of the second resonator 182. Each cap 172, 174 includes a center platform 176 and a plurality of supporting members 178.

A first set of drive electrodes 190 is disposed adjacent to the first resonant mass 184 along a periphery of the first resonant mass. The first set of drive electrodes 190 is configured to vibrate the first resonant mass 184 along an axis defining the first geometric plane. A second set of drive electrodes 192 is disposed adjacent to the second resonant mass 184 along a periphery of the second resonant mass. The second set of drive electrodes 192 is configured to vibrate the second resonant mass along same axis as the first resonant mass but at 180 degrees out-of-phase with the first resonant mass.

Figure 6A:
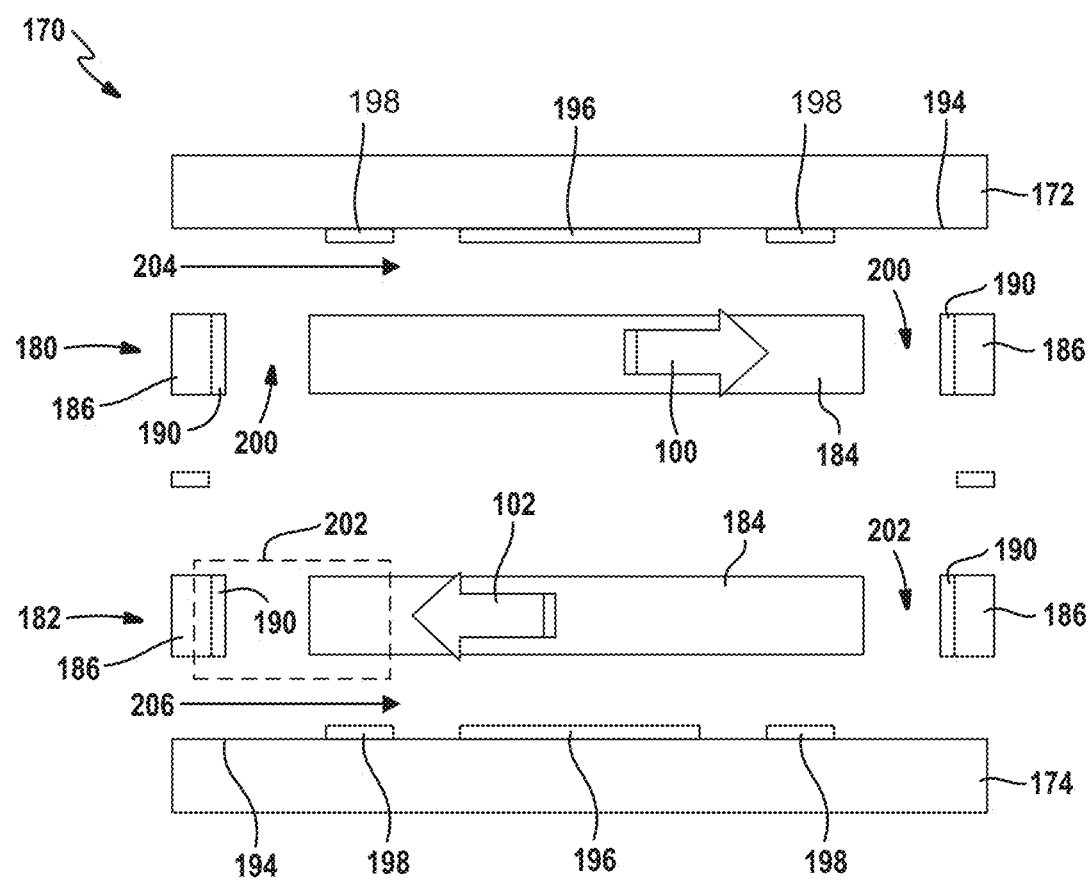
FIGS. 6A and 6B are cross-sectional schematics of the exemplary gyroscope system illustrating drive mode and sense mode, respectively.
Figure 6B:
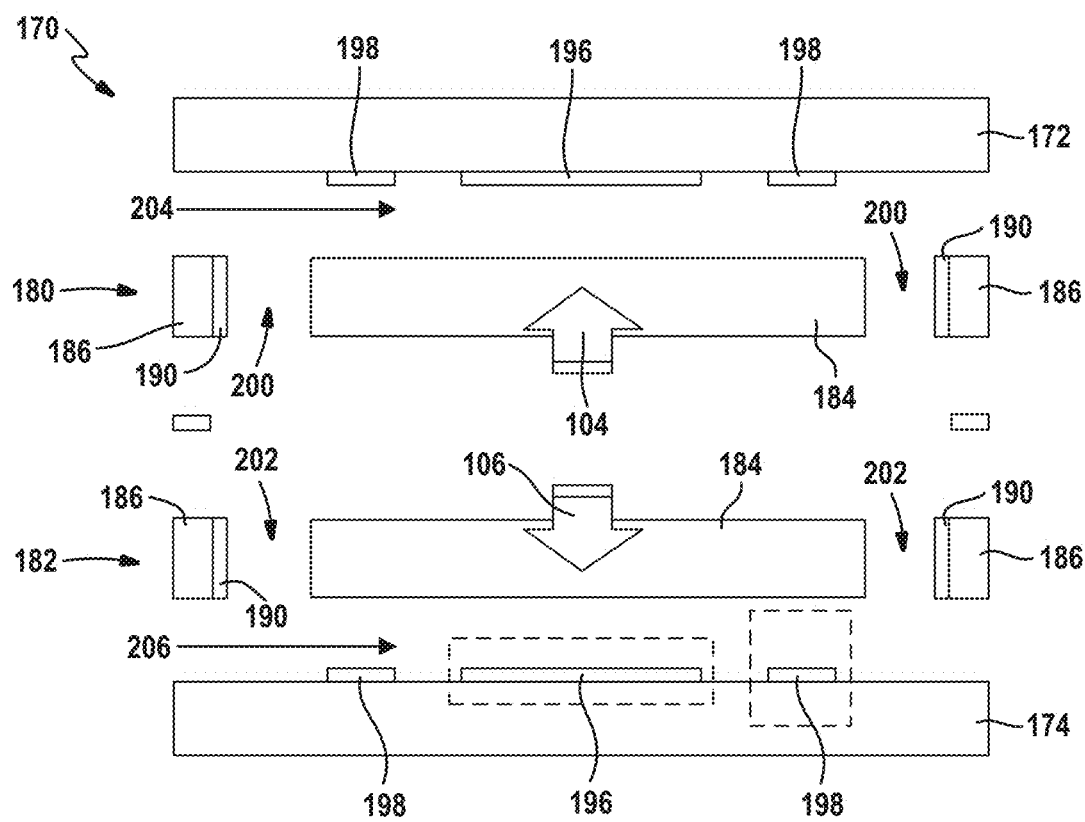

FIGS. 6A and 6B illustrate operation of the gyroscope system 170. Each cap 172, 174 has a first surface 194 facing the respective resonant plate 184 of the first and second resonators 180, 182. Sense electrodes 196 and tuning electrodes 198 are disposed on the first surface 194 of each cap 172, 174. Sense electrodes 196 disposed on the first surface 194 of the first cap 172 (i.e., the first set of sensing electrodes) sense the vertical motion of the resonant plate 184 of the first resonator 180. Sense electrodes 196 disposed on the first surface 194 of the second cap 174 (i.e., the second set of sensing electrodes) sense the vertical motion of the resonant plate 184 of the second resonator 182.

Tuning electrodes 198 disposed on the first surface 194 of the first cap 172 (i.e., the first set of tuning electrodes) tune an out-of-plane resonant frequency of the resonant plate 184 of the first resonator 180. Tuning electrodes 198 disposed on the first surface 194 of the second cap 174 (i.e., the second set of tuning electrodes) tune an out-of-plane resonant frequency of the resonant plate 184 of the second resonator 182. The tuning electrodes 198 may have a large area and a small gap to increase the tuning capability of the gyroscope 170. It is desirable that the sensing and driving modes have the same resonant frequencies. However, imperfections during the fabrication process may result in minor differences between the resonant frequencies of the driving and sensing modes. The tuning electrodes 198 may be used to correct for differences between the resonant frequencies of the sensing and driving modes of the gyroscope 170. Other tuning electrodes, not shown, may be placed around the perimeter of the resonant plates 184 to tune the in-plane resonant frequency of the plates 184. The difference may be corrected using electrostatic spring softening phenomenon, which changes the natural frequency of a mechanical structure using an electric field that surrounds the structure. Using this method, one mode—either the sensing mode or the driving mode—is reduced until it is equivalent with the other mode.

Lateral drive electrodes 190 are disposed adjacent the support structures 186 of each resonator 180, 182. The lateral drive electrodes 190 may be parallel plate actuators or comb-drive actuators. Drive gaps 200, 202 exist between the resonant plates 184 of the first and second resonators 180, 182 and the laterally disposed drive electrodes 190. A first drive gap 200 exists between the resonant plate 184 of the first resonator 180 and the laterally disposed drive electrodes 190. A second drive gap 202 exists between the resonant plate 184 of the second resonator 182 and the laterally disposed drive electrodes 190.

Sense gaps 204, 206 exist between the first and second caps 172, 174 and the respective resonators 180, 182. First sense gaps 204 exist between the first cap 172 and the resonating plates 184 of the first resonator 180; whereas, second sense gaps 206 exist between the second cap 174 and the resonating plate 184 of the second resonator 182. The sense gaps 204 and 206 are easily adjustable. Decreasing the sense gaps 204 and 206 increases the sensing capacitance, which increases the sensitivity of the gyroscope 170. Decreasing the sense gaps 204 and 206 also increases the tuning capability of the gyroscope. The tuning capacity reflects the matching of resonant frequencies of the sensing and driving modes.

The drive gaps 200, 202 are also easily adjustable. Increasing the drive gaps 200, 202 increases the driving amplitude in the resonators 180, 182 while reducing the noise, which improves the performance of a gyroscope. Sizing of the drive gaps 200, 202 and the sense gaps 204, 206 are independent of each other, thereby simultaneously providing low noise and high sensitivity. Generally, it is desirable to reduce electrical and Brownian noises, which can be completed by independently increasing the driving amplitude (drive gaps) and decreasing the sense gaps.

FIG. 6A illustrates the drive mode, which is when the drive electrodes 190 cause the resonant plates 184 of the first and second resonators 180, 182 to vibrate. The drive electrodes 190 of the first resonator 180 (i.e., the first set of lateral drive electrodes) cause the resonator plate 184 (i.e., the first resonator mass) of the first resonator 180 to vibrate along an axis in a first geometric plane. The drive electrodes 190 of the second resonator 182 (i.e., the second set of lateral drive electrodes) cause the resonator plate 184 of the second resonator 182 (i.e., the second resonator mass) to vibrate along an axis in a second geometric plane in an opposite direction of the resonator plate 184 of the first resonator 180 by about 180 degrees out-of-phase with the first resonator 180. Arrow 100 illustrates the movement of the resonant plate 184 of the first resonator 180. Arrow 102 illustrates the opposing in-plane movement of the resonant plate 184 of the second resonator 182.

When there is pitch or roll rotation in the system, Coriolis acceleration causes the resonant plate 184 of the first resonator 180 and the resonant plate 184 of the second resonator 182 to vibrate out-of-plane in opposite directions. The out-of-plane movement of the resonant plate 184 of the first resonator 180 and the resonant plate 184 of the second resonator 182 is illustrated in FIG. 6B. Arrow 104 illustrates the movement of the resonant plate 184 of the first resonator 180. Arrow 106 illustrates the opposing out-of-plane movement of the resonant plate 184 of the second resonator 182.

The opposite motion of the resonant plate 184 of the first resonator 180 with respect to the resonant plate 184 of the second resonator 182 reduces the movement in the bonding area between the two resonators 180, 182, which results in a low anchor loss and a high Q-factor.

Increasing the thickness of the resonators 180, 182 typically increases the anchor loss in at least one of the resonators 180, 182. However, the lower anchor loss and increased Q-factor resulting from the stacked balanced resonators design allows the thickness of the resonators to be increased. For example, in certain instances, each resonator 12, 14 may have a thickness of 500 μm. The increased thickness of the resonators increases the effective (modal) mass of the gyroscope, which decreases noise and increases performance. The increased thickness of the resonators also provides a stiffer gyroscope, which is robust to external shocks and vibrations. Moreover, as the thickness of the resonators increases the thermal transport time constant increases, which reduces the TED loss.

FIGS. 7A-7G illustrates an example fabrication technique for constructing the resonator with a stacked arrangement. A silicon on Glass (SOG) process is used to fabricate two separate batches of bounded silicon and glass. The two batches are then bounded together to form the resonator device. SOG micromachining is based on fabricating microstructures defined by through-etching of a silicon wafer bonded to a glass wafer. These silicon and glass wafers are bonded together, for example using anodic bonding approach. This process is merely exemplary and other fabrication processes using other materials are contemplated by this disclosure.

Figure 7A:
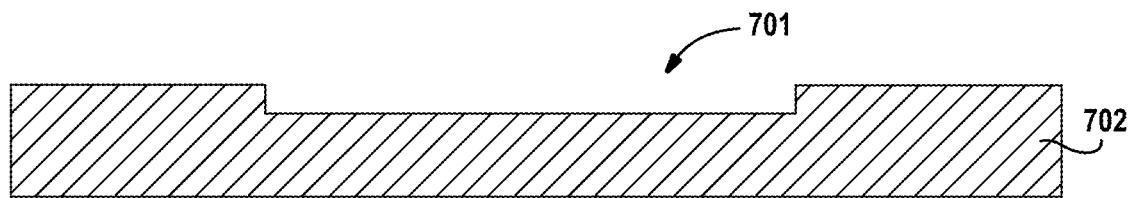
FIGS. 7A-7G are cross-section view of an example fabrication technique for constructing a resonator with a stacked arrangement.

First, a recess 701 is created in a glass wafer 702 as seen in FIG. 7A. Glass wafers can be selectively etched to produce a recess inside glass wafers. For example, the etch process can be wet etching or reactive ion etching (i.e., dry etching). In example embodiment, the thickness of the glass wafer is about 500 μm and the depth of the recess is about 5 μm.

Figure 7B:

Metallic electrodes 703 will be disposed inside this recess 701 as seen in FIG. 7B. The recess 701 can work as a gap between silicon layer and glass layer. The metal layers (e.g., Ti/Pt) are deposited and then patterned on glass wafer 702. These metal layers work as the electrodes as well as electrical connections. In the example embodiment, the thickness of the metal layers is about 200 nm.

Figure 7C:
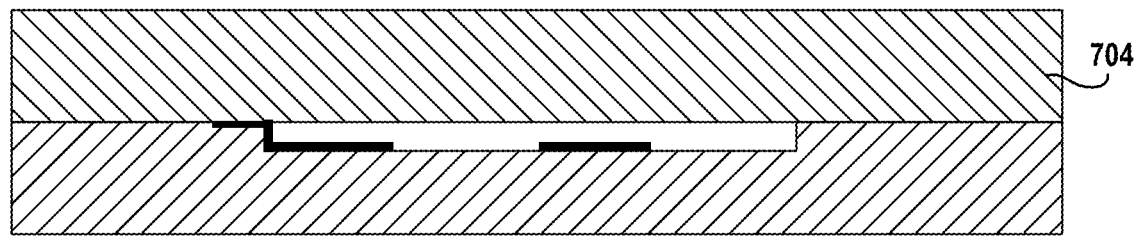

Next, a silicon wafer 704 is bonded to the glass wafer 702 as seen in FIG. 7C. In this step, the silicon wafer 704 is bonded using anodic bonding although other types of bonding are contemplated as well. In the example embodiment, the thickness of the silicon layer is about 500 μm.

Figure 7D:
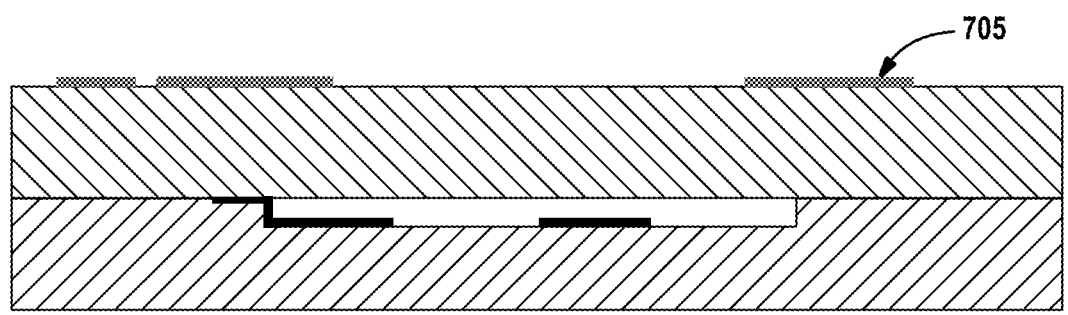

FIG. 7D shows metal 705 being deposited onto the silicon wafer 704. Gold or some other type of metal is deposited on top of the silicon layer 704 and then patterned. This metal will be used for bonding (coupling) two silicon layers. In the example embodiment, the thickness of the metal layer is about 1-5 μm.

Figure 7E:
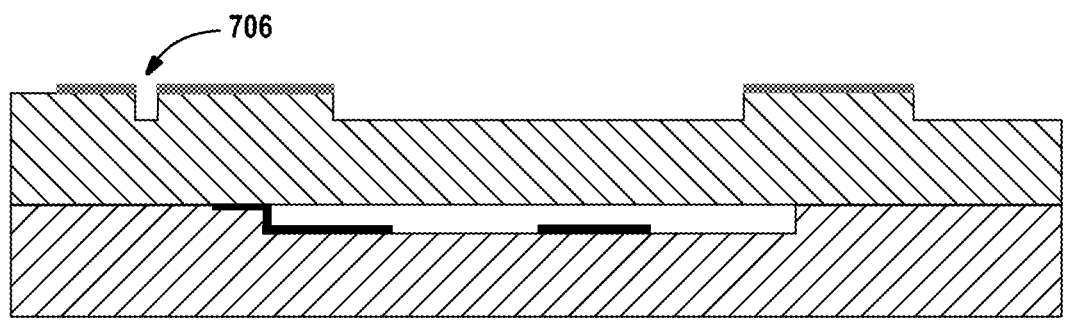

In FIG. 7E, the silicon is etched at 706. This etching will produce space for the stacked masses to vibrate out of plane without touching each other. The bonding area will not be etched in this step.

Figure 7F:
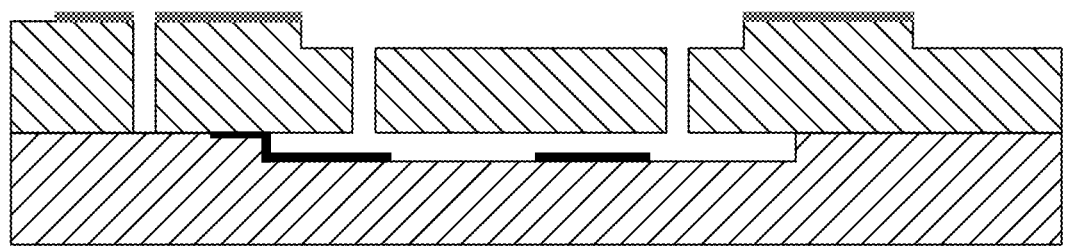

To form a resonant mass and its support structure, the silicon wafers are selectively etched as seen in FIG. 7F. For example, the silicon wafers may be selectively etched using Deep Reactive-Ion Etching (DRIE). In this way, one can achieve the desired pattern in the silicon layers. Although not shown, the elastic member coupling the resonant mass to the support structure are also formed using similar etching methods.

Figure 7G:
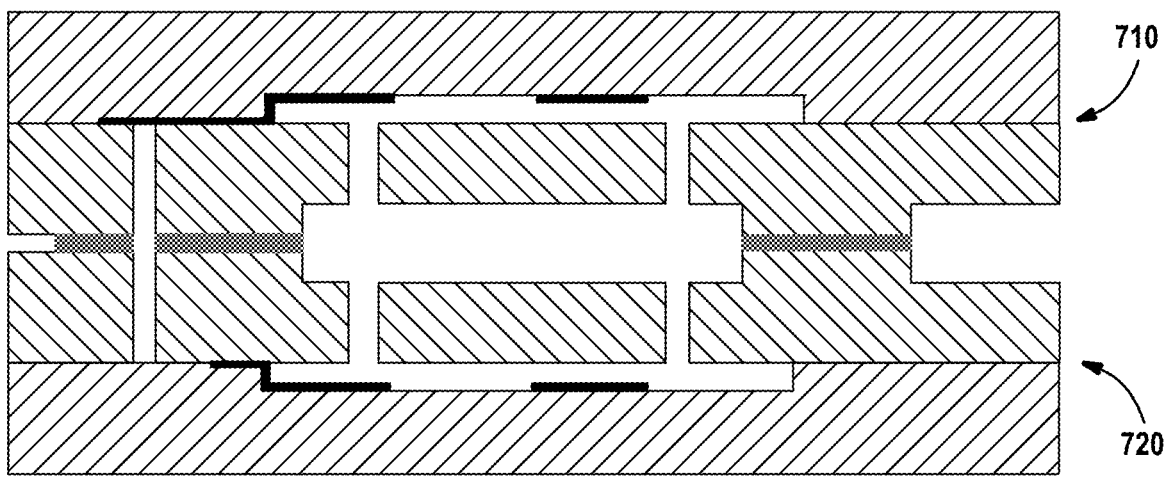

Lastly, two SOG batches 710, 720 are bonded together to form the stacked balanced resonator as seen in FIG. 7G. In the example embodiment, the layers are bonded using eutectic bonding. Different approaches are envisioned for bonding these layers together.

Example embodiments are provided so that this disclosure will be thorough, and will fully convey the scope to those who are skilled in the art. Numerous specific details are set forth such as examples of specific components, devices, and methods, to provide a thorough understanding of embodiments of the present disclosure. It will be apparent to those skilled in the art that specific details need not be employed, that example embodiments may be embodied in many different forms and that neither should be construed to limit the scope of the disclosure. In some example embodiments, well-known processes, well-known device structures, and well-known technologies are not described in detail.

The terminology used herein is for the purpose of describing particular example embodiments only and is not intended to be limiting. As used herein, the singular forms "a," "an," and "the" may be intended to include the plural forms as well, unless the context clearly indicates otherwise. The terms "comprises," "comprising," "including," and "having," are inclusive and therefore specify the presence of stated features, integers, steps, operations, elements, and/or components, but do not preclude the presence or addition of one or more other features, integers, steps, operations, elements, components, and/or groups thereof. The method steps, processes, and operations described herein are not to be construed as necessarily requiring their performance in the particular order discussed or illustrated, unless specifically identified as an order of performance. It is also to be understood that additional or alternative steps may be employed.

When an element or layer is referred to as being "on," "engaged to," "connected to," or "coupled to" another element or layer, it may be directly on, engaged, connected or coupled to the other element or layer, or intervening elements or layers may be present. In contrast, when an element is referred to as being "directly on," "directly engaged to," "directly connected to," or "directly coupled to" another element or layer, there may be no intervening elements or layers present. Other words used to describe the relationship between elements should be interpreted in a like fashion (e.g., "between" versus "directly between," "adjacent" versus "directly adjacent," etc.). As used herein, the term "and/or" includes any and all combinations of one or more of the associated listed items.

Although the terms first, second, third, etc. may be used herein to describe various elements, components, regions, layers and/or sections, these elements, components, regions, layers and/or sections should not be limited by these terms. These terms may be only used to distinguish one element, component, region, layer or section from another region, layer or section. Terms such as "first," "second," and other numerical terms when used herein do not imply a sequence or order unless clearly indicated by the context. Thus, a first element, component, region, layer or section discussed below could be termed a second element, component, region, layer or section without departing from the teachings of the example embodiments.

Spatially relative terms, such as "inner," "outer," "beneath," "below," "lower," "above," "upper," and the like, may be used herein for ease of description to describe one element or feature's relationship to another element(s) or feature(s) as illustrated in the figures. Spatially relative terms may be intended to encompass different orientations of the device in use or operation in addition to the orientation depicted in the figures. For example, if the device in the figures is turned over, elements described as "below" or "beneath" other elements or features would then be oriented "above" the other elements or features. Thus, the example term "below" can encompass both an orientation of above and below. The device may be otherwise oriented (rotated 90 degrees or at other orientations) and the spatially relative descriptors used herein interpreted accordingly.

The foregoing description of the embodiments has been provided for purposes of illustration and description. It is not intended to be exhaustive or to limit the disclosure. Individual elements or features of a particular embodiment are generally not limited to that particular embodiment, but, where applicable, are interchangeable and can be used in a selected embodiment, even if not specifically shown or described. The same may also be varied in many ways. Such variations are not to be regarded as a departure from the disclosure, and all such modifications are intended to be included within the scope of the disclosure.

What is claimed is:

1. A resonator, comprising:
   a first resonant mass spatially separated from a first support structure and movably coupled by at least one elastic member at an anchor point to the first support structure, where the first resonant mass has a longitudinal axis residing in a first geometric plane;
   a first set of drive electrodes disposed adjacent to the first resonant mass along a periphery of the first resonant mass, where the first set of drive electrodes is configured to vibrate the first resonant mass along an axis defining the first geometric plane;
   a second resonant mass spatially separated from a second support structure and movably coupled by at least one elastic member at an anchor point to the second support structure, where the second resonant mass has a longitudinal axis residing in a second geometric plane which differs from the first geometric plane but is substantially parallel with the first geometric plane; and
   a second set of drive electrodes disposed adjacent to the second resonant mass along a periphery of the second resonant mass, where the second set of drive electrodes is configured to vibrate the second resonant mass along the same axis as the first resonant mass but 180 degrees out-of-phase with movement of the first resonant mass;
   wherein the first support structure is a planar body having a cutout therein and the first resonant mass is a planar body arranged in the cutout of the first support structure; and the second support structure is a planar body having a cutout therein and the second resonant mass is a planar body arranged in the cutout of the second support structure.

2. The resonator of claim 1 wherein the first resonant mass is movably coupled by two or more elastic members at two or more anchor points to the first support structure and the second resonant mass is movably coupled by two or more elastic members at two or more anchor points to the second support structure, such that each anchor point on the first support structure aligns with and is fixedly coupled to a corresponding anchor point on the second support structure.

3. The resonator of claim 2 wherein the first support structure is directly bonded to the second support structure.

4. The resonator of claim 2 wherein the first support structure is bonded to the second support structure using a bonding layer.

5. The resonator of claim 2 wherein the first support structure and the second support structure each have a thickness on the order of 500 μm.

6. The resonator of claim 1 wherein the at least one elastic member is further defined as a meander spring.

7. The resonator of claim 1 further comprises
   a first set of sense electrodes disposed adjacent to the first resonant mass and configured to sense movement of the first resonant mass; and
   a second set of sense electrodes disposed adjacent to the second resonant mass and configured to sense movement of the second resonant mass.

8. The resonator of claim 1 is incorporated into a gyroscope.

9. A resonator, comprising:
   a first resonant mass spatially separated from a first support structure and movably coupled by at least one elastic member at an anchor point to the first support structure, where the first resonant mass has a longitudinal axis residing in a first geometric plane;
   a first set of drive electrodes disposed adjacent to the first resonant mass along a periphery of the first resonant mass, where the first set of drive electrodes is configured to vibrate the first resonant mass along an axis defining the first geometric plane;
   a second resonant mass spatially separated from a second support structure and movably coupled by at least one elastic member at an anchor point to the second support structure, where the second resonant mass has a longitudinal axis residing in a second geometric plane which differs from the first geometric plane but is substantially parallel with the first geometric plane;

a second set of drive electrodes disposed adjacent to the second resonant mass along a periphery of the second resonant mass, where the second set of drive electrodes is configured to vibrate the second resonant mass along the same axis as the first resonant mass but 180 degrees out-of-phase with movement of the first resonant mass;

a first set of tuning electrodes disposed adjacent to the first resonant mass and configured to generate an electric field that surrounds the first resonant mass and thereby changes natural oscillating frequency of the first resonant mass; and a second set of tuning electrodes disposed adjacent to the second resonant mass and configured to generate an electric field that surrounds the second resonant mass and thereby changes natural oscillating frequency of the second resonant mass.

10. A resonator, comprising:

a first resonant mass spatially separated from a first support structure and movably coupled by at least one elastic member at an anchor point to the first support structure, where the first resonant mass has a longitudinal axis residing in a first geometric plane;

a first set of drive electrodes disposed adjacent to the first resonant mass along a periphery of the first resonant mass, where the first set of drive electrodes is configured to vibrate the first resonant mass along an axis defining the first geometric plane;

a second resonant mass spatially separated from a second support structure and movably coupled by at least one elastic member at an anchor point to the second support structure, where the second resonant mass has a longitudinal axis residing in a second geometric plane which is spatially offset from the first geometric plane; and a second set of drive electrodes disposed adjacent to the second resonant mass along a periphery of the second resonant mass, where the second set of drive electrodes is configured to vibrate the second resonant mass along the same axis as the first resonant mass but 180 degrees out-of-phase with movement of the first resonant mass wherein the first geometric plane is substantially parallel with the second geometric plane and the first resonant mass overlays the second resonant mass such that each anchor point on the first support structure is fixedly coupled to a corresponding anchor point on the second support structure;

wherein the first support structure is a planar body having a cutout therein and the first resonant mass is a planar body arranged in the cutout of the first support structure; and the second support structure is a planar body having a cutout therein and the second resonant mass is a planar body arranged in the cutout of the second support structure.

11. The resonator of claim 10 wherein the first resonant mass is movably coupled by four elastic members at four anchor points to the first support structure and the second resonant mass is movably coupled by four elastic members at four anchor points to the second support structure.

12. The resonator of claim 11 wherein first support structure is directly bonded to the second support structure.

13. The resonator of claim 12 wherein the first support structure and the second support structure each have a thickness on the order of 500 µm.

14. The resonator of claim 10 wherein the at least one elastic member is further defined as a meander spring.

15. The resonator of claim 10 further comprises
a first set of sense electrodes disposed adjacent to the first resonant mass and configured to sense movement of the first resonant mass; and
a second set of sense electrodes disposed adjacent to the second resonant mass and configured to sense movement of the second resonant mass.

16. The resonator of claim 10 is incorporated into a gyroscope.

17. A resonator, comprising:

a first resonant mass spatially separated from a first support structure and movably coupled by at least one elastic member at an anchor point to the first support structure, where the first resonant mass has a longitudinal axis residing in a first geometric plane;

a first set of drive electrodes disposed adjacent to the first resonant mass along a periphery of the first resonant mass, where the first set of drive electrodes is configured to vibrate the first resonant mass along an axis defining the first geometric plane;

a second resonant mass spatially separated from a second support structure and movably coupled by at least one elastic member at an anchor point to the second support structure, where the second resonant mass has a longitudinal axis residing in a second geometric plane which is spatially offset from the first geometric plane;

a second set of drive electrodes disposed adjacent to the second resonant mass along a periphery of the second resonant mass, where the second set of drive electrodes is configured to vibrate the second resonant mass along the same axis as the first resonant mass but 180 degrees out-of-phase with movement of the first resonant mass wherein the first geometric plane is substantially parallel with the second geometric plane and the first resonant mass overlays the second resonant mass such that each anchor point on the first support structure is fixedly coupled to a corresponding anchor point on the second support structure;

a first set of tuning electrodes disposed adjacent to the first resonant mass and configured to generate an electric field that surrounds the first resonant mass and thereby changes natural oscillating frequency of the first resonant mass; and a second set of tuning electrodes disposed adjacent to the second resonant mass and configured to generate an electric field that surrounds the second resonant mass and thereby changes natural oscillating frequency of the second resonant mass.

* * * * *